United States Patent [19]
Sato

[11] Patent Number: 5,317,205
[45] Date of Patent: May 31, 1994

[54] SEMICONDUCTOR INTEGRATED CIRCUIT AND ASSOCIATED TEST METHOD

[75] Inventor: Fumihiko Sato, Tokyo, Japan
[73] Assignee: NEC Corporation, Tokyo, Japan
[21] Appl. No.: 892,196
[22] Filed: Jun. 2, 1992
[30] Foreign Application Priority Data Jun. 26, 1991 [JP] Japan .................................. 3-153660

[51] Int. Cl.⁵ .............................................. H03K 3/289
[52] U.S. Cl. ................................. 307/443; 307/272.2; 371/22.3
[58] Field of Search ............... 307/443, 465; 371/22.1, 371/22.3

[56] References Cited
U.S. PATENT DOCUMENTS

| | | | |
|---|---|---|---|
| 4,580,137 | 4/1986 | Fiedler | 371/22.3 |
| 5,105,100 | 4/1992 | Yamada | 371/22.3 |
| 5,122,738 | 6/1992 | Simpson | 371/22.1 |
| 5,130,568 | 7/1992 | Miller | 371/22.3 |

Primary Examiner—Edward P. Westin
Assistant Examiner—Andrew Sanders

[57] ABSTRACT

A semiconductor integrated circuit includes a sequential circuit including a plurality of flip-flops which latch and keep data supplied to an input terminal at a prescribed timing and which perform prescribed sequential treatments of the input data, and a combinational circuit implemented at the input and/or output terminals of the sequential circuit and which performs a prescribed combinational treatment or treatments of the input and-/or output data to and/or from the sequential circuit. The semiconductor integrated circuit also includes a data-through circuit operated by an external control signal configured to transfer the data supplied to the input terminal direct to an output terminal of a prescribed flip-flop of the plurality flip-flops constituting the sequential circuit.

4 Claims, 3 Drawing Sheets

SEMICONDUCTOR INTEGRATED CIRCUIT AND ASSOCIATED TEST METHOD

BACKGROUND OF THE INVENTION

1. Field of the Invention

The present invention relates generally to a semiconductor integrated circuit, and, in particular, with emphasis on a semiconductor integrated circuit of the type with combinational and sequential circuits being implemented therein so that the fault coverage of said semiconductor integrated circuit can be improved.

2. Description of the Related Art

The conventional practice of testing a semiconductor integrated circuit of the type described above is to read out data memorized in the sequential circuit by means of the Scan Path circuit system with the intention of improving fault coverage.

FIG. 1a shows a block diagram of a conventional semiconductor integrated circuit. FIG. 1b is a partial circuit diagram of such a semiconductor integrated circuit showing the flip-flop circuit portion constituting the Scan Path circuit.

The construction of the semiconductor integrated circuit referred to above usually incorporates a first combinational circuit 11a which serves to combine data DIN and DT in a prescribed manner, and a sequential circuit 12b consisting of a plurality of flip-flop circuits (latch circuits) to perform sequential processing of the data from combinational circuit 11a when the scan mode control signal SMC is in the inactive mode and a second combinational circuit 11b which serves to yield data DOUT to be delivered externally and data DT to be delivered to combinational circuit 11a as the outputs of the prescribed processing of sequential circuit 12b.

The Scan Path circuit is provided as a part of the sequential circuit 12b described above to serve as a shift register when scan mode control signal SMC is at the active mode. This can be achieved by a plurality of flip-flops 111 and 112a connected to multiplexer 113 as shown in FIG. 1b.

The operation of the semiconductor integrated circuit can be tested by using sequential circuit 12b as the Scan Path circuit. This can be achieved by keeping the scan mode control signal SMC is at the active mode. Thus, improvements in fault coverage can be expected.

Next, a detailed explanation of the operation of sequential circuit 12b is given below. A pair of inputs to multiplexer 113 consists of the serial Scan Path data SIN and of input data IN as is usually the case and available as the output of combinational circuit 11a. Either one of the inputs is supplied to flip-flop 111, as the output of the multiplexer depending on whether the scan mode control signal SMC is at the active or inactive levels.

Among the typical test items of a semiconductor integrated circuit are the one to confirm the output data DOUT of combinational circuit 11b when Scan Path data SIN is set on sequential circuit 12b keeping scan mode control signal SMC is at the active mode. Another typical test item is the confirmation of the output contents of sequential circuit 12b when output data IN of combinational circuit 11a is supplied to the sequential circuit 12b as the input, keeping scan mode control signal SMC is at the inactive mode.

Since a semiconductor integrated circuit can thus be tested as a combinational circuit by using sequential circuit 12b as a shift register, the effect of improving fault coverage has been established.

FIG. 1b shows the construction of each flip-flop 111 (112a) consisting of a first transfer gate T11 (T13) designed to transfer and control the data supplied to the input terminal by turning on and off clock signal CK and the inverted signal thereof, a first inverter IV11 (IV13) designed to invert the level of the output data derived from said first transfer gate T11 (T13) and transfer it to the output terminal, a second inverter IV12 (IV14) designed to invert the level of the data from the first inverter IV11 (IV13) and the second transfer gate T12 (T14) designed to transfer and control the data to a input terminal by turning on and off clock signal CK and the inverted signal thereof in reverse polarity to first transfer gate T11 (T13).

Moreover, the on and off operations of transfer gates T11 and T12 of flip-flop 111 are opposite in polarity to the transfer gates T13 and T14 of flip-flop 112a, respectively, and, therefore, the pair of flip-flops 111 and 112a functions as a D-type flip-flop (data latch circuit).

Since conventional semiconductor integrated circuits are so constructed that sequential circuit 12b is recombined to form a Scan Path circuit when the test mode operation is desired with the intention of improving fault coverage, a large number of input and output terminals are needed to comply with the dual purpose of switching between ordinary and Scan Path circuit operations as well as to apply and extract data in and out of the Scan Path circuit itself. Further, an increase in overhead caused by the use of multiplexer 113 for the circuit recombination is unavoidable.

SUMMARY OF THE INVENTION

The object of the present invention is to provide a semiconductor integrated circuit with a smaller number of input and output terminals required for testing and, at the same time, with lower overhead.

The semiconductor integrated circuit of the present invention is featured by providing in the semiconductor processing circuit a sequential circuit consisting of a plurality of flip-flops which latch and keep the data supplied to the input terminal at a prescribed timing and which perform prescribed sequential treatments of the input data by providing in said processing circuit a combinational circuit or circuits which are implemented at the input and/or output terminals of said sequential circuit and which perform a prescribed combinational treatment or treatments of the input and/or output data to and/or from the sequential circuit, respectively, and by providing a data-through means for transferring the data supplied to the input terminal direct to the output terminal by means of a control signal applied externally to the prescribed flip-flop of the flip-flops constituting the aforementioned sequential circuit.

Here, the semiconductor integrated circuit can consist of a first transfer gate which transfers and controls the input data supplied by switching on and off the flip-flops in accordance with the clock signal, of a first inverter which receives the output data supplied by the first transfer gate and inverts the polarity of the resultant signal to be transferred to the output terminal thereof, of a second inverter which receives the output data of said first inverter and inverts the polarity of the resultant signal to be transferred to the output terminal thereof and of the second transfer gate which transfers and controls the output data of said second inverter to the input of said first inverter so that the second transfer gate is turned on and off in opposite polarity to the first transfer gate in accordance with said clock signal, data-through means consisting of a third transfer gate connected in parallel to said first transfer gate and turned on and off by means of said control signal and of a fourth transfer gate connected in series to said second transfer gate and turned on and off in opposite polarity to the third transfer gate by means of said control signal.

Incidentally, the test method of the semiconductor integrated circuit of the present invention is applicable to using conventional data, provided that the data-through means, incorporated in the prescribed flip-flops constituting said sequential circuit is operated by the external control signal to serve as the transfer circuit of the input data of the prescribed flip-flops direct to the output terminal.

Thus, the semiconductor integrated circuit of the present invention having the constitution fully described above can be tested as a single combinational circuit by utilizing the flip-flops incorporated in the sequential circuit as the data-through means.

The above and other objects, features and advantages of the present invention will become apparent from the following description referring to the accompanying drawings which illustrate an example of a preferred embodiment of the present invention.

BRIEF DESCRIPTION OF THE DRAWINGS

FIG. 1b shows a circuit diagram of a concrete example of the flip-flop circuit portion of the semiconductor integrated circuit shown in FIG. 1a.

FIG. 2b shows a circuit diagram of a concrete example of the flip-flop circuit portion of the semiconductor integrated circuit shown in FIG. 2a.

FIG. 3b shows a circuit diagram of a concrete example of the flip-flop circuit portion of the semiconductor integrated circuit shown in FIG. 3a.

DETAILED DESCRIPTION OF THE PREFERRED EMBODIMENTS

Figure 2A:
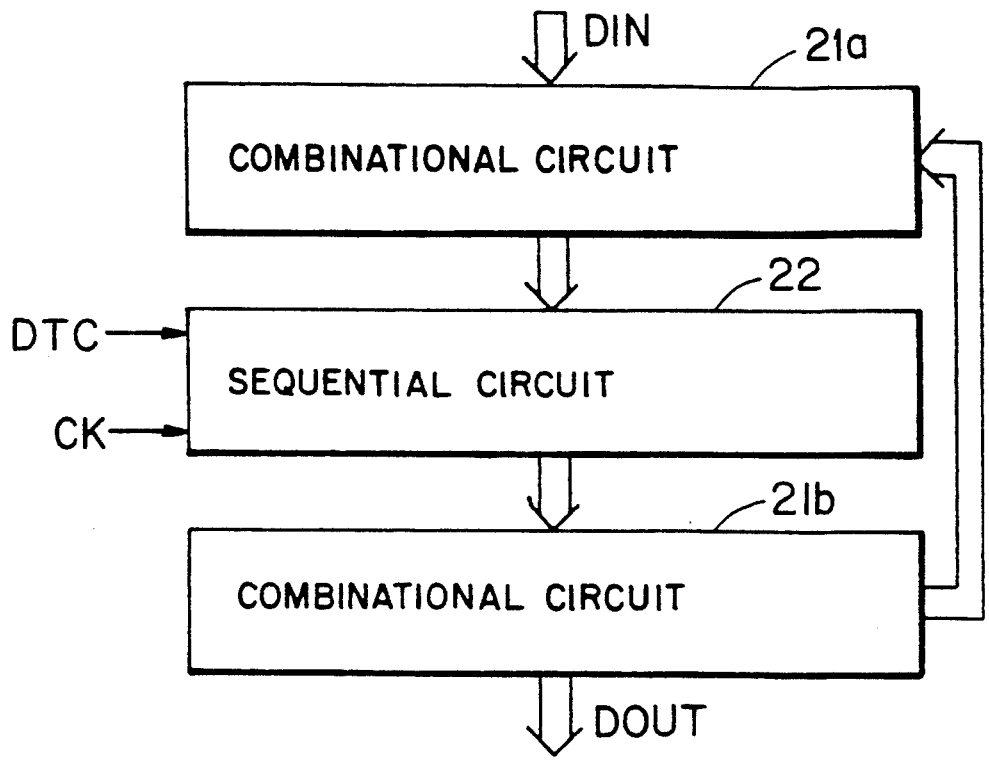
FIG. 2a shows a block diagram of a first practical example of the semiconductor integrated circuit of the present invention.
Figure 2B:
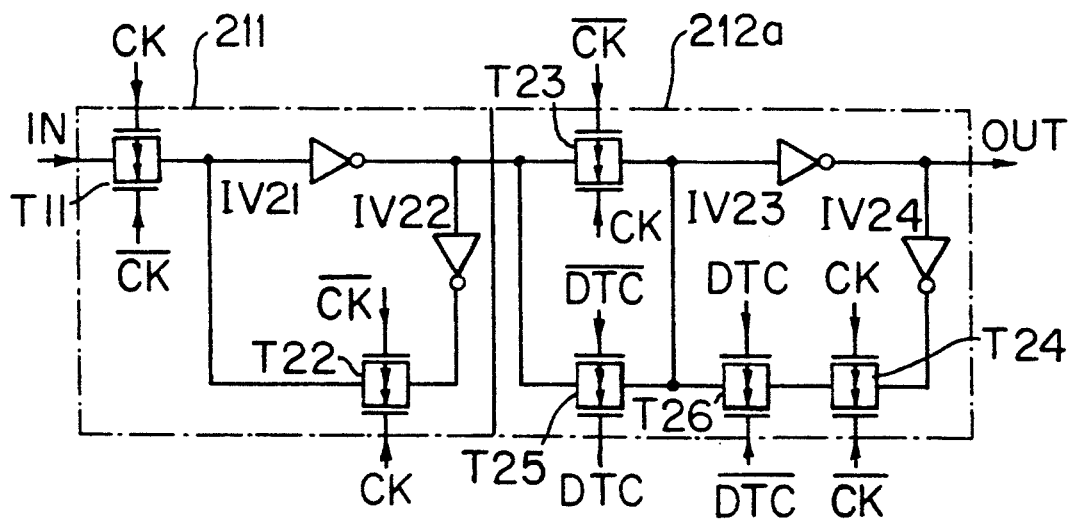

FIG. 2a and FIG. 2b are block and circuit diagrams, respectively, of the flip-flop circuit portion of the first practical example of the semiconductor integrated circuit of the present invention.

The first practical example of the semiconductor integrated circuit of the present invention introduced above is different from the case of conventional semiconductor integrated circuits in that only ordinary data DIN comes out through combinational circuit 21a, sequential circuit 22 and combinational circuit 21b as output data DOUT eliminating the switching operation by multiplexer 113 used for selecting either the Scan Path data SIN or ordinary data IN. Another point of difference between the circuit of the first practical example above and conventional circuit is that a data-through means, designed to transfer the input data direct to the output terminal by means of external control signal DTC, is provided, the input data being supplied by a prescribed flip-flop among a plurality of flip-flops incorporated in sequential circuit 22.

As shown in FIG. 2b, the concrete scheme of the data-through operation consists of third transfer gate T25 connected in parallel to the first transfer gate T23 of flip-flop 212a being turned on and off by means of the control signal DTC and the inverted signal thereof, and of fourth transfer gate T26, connected in series with the output terminal of second inverter IV24 and the input terminal of first inverter IV23 of flip-flop 212a being turned on and off by means of control signal DTC and the inverted signal thereof in reverse polarity to third transfer gate T25.

Flip-flop 212a becomes data-through with no regard to the polarity of the clock signal CK when the control signal DTC is at the active mode. On the other hand, when control signal DTC is at the inactive mode, the input data are taken into said flip-flop and allowed to go through direct when clock signal CK is at the active mode, while the input data are preserved along with ordinary flip-flop operation when clock signal CK is at the inactive mode.

Figure 1A:
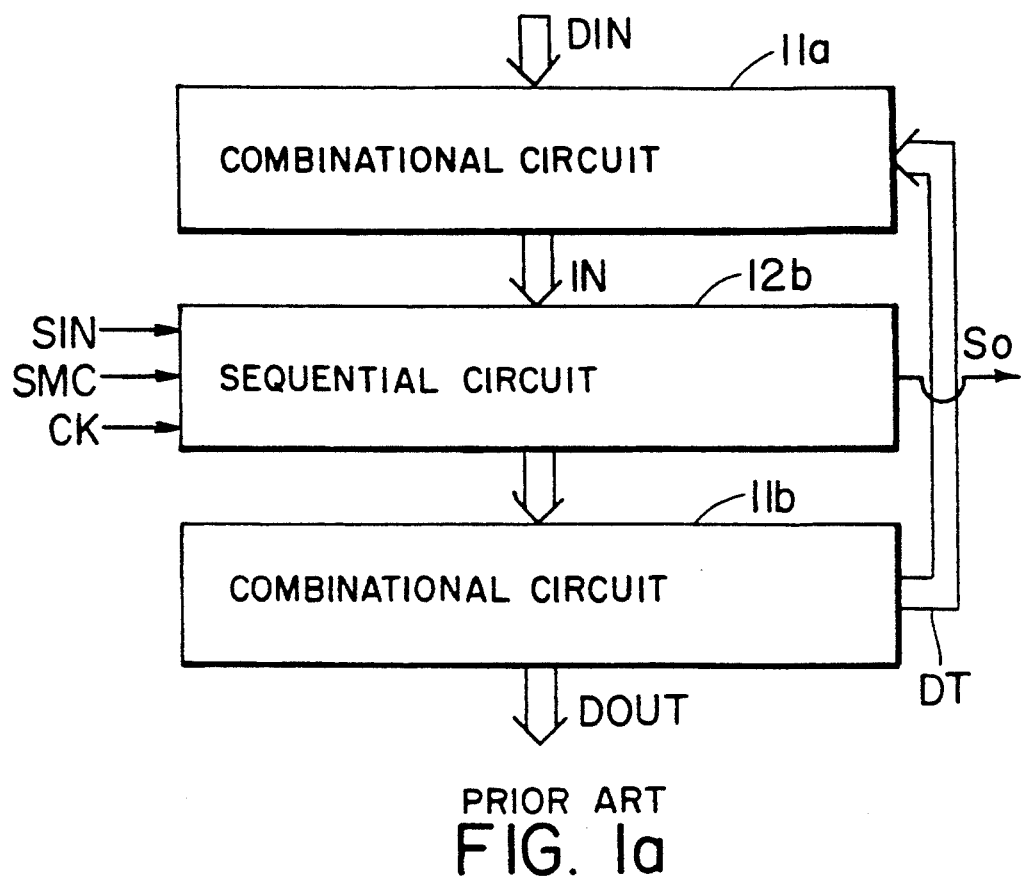
FIG. 1a shows a block diagram of an example of a conventional semiconductor integrated circuit.
Figure 1B:
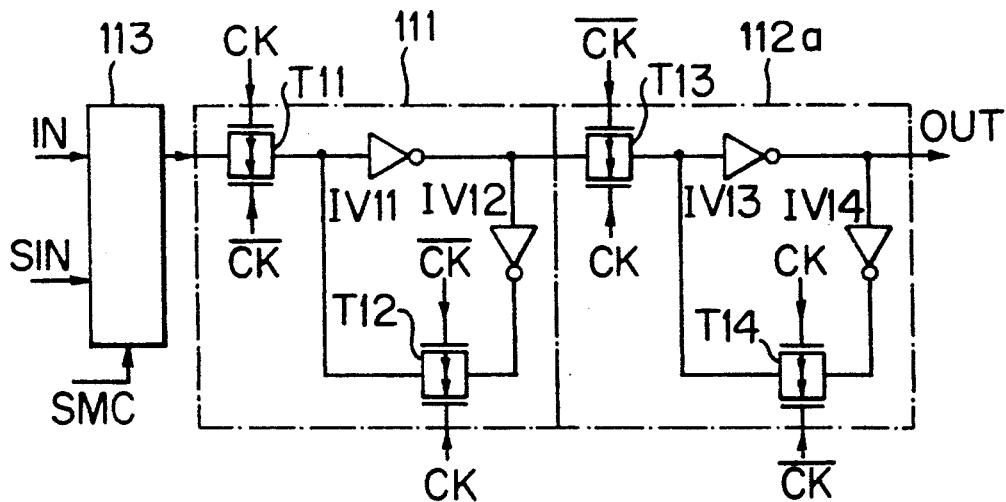

Inverters IV21 and IV22 constituting flip-flop 211 and transfer gate T22 are identical with inverters IV11, IV12 and transfer gate T12, respectively, of the conventional example shown in FIG. 1b. Flip-flop 211 preserves the input data received during the preceding cycle when clock signal CK is at the active mode. On the other hand, flip-flop 211 is operated as an ordinary flip-flop by letting the input data go through direct when clock signal CK is at the inactive mode.

The pair of flip-flops 211 and 212a, therefore, constitutes an ordinary D-flip-flop (data latch circuit) when control signal DTC is at the inactive mode and constitutes a data-through circuit when the control signal DTC is at the active mode and the clock signal CK is at the inactive mode.

When the control signal DTC is at the inactive mode, third transfer gate T25 of flip-flop 212a is turned off and the fourth transfer gate T26 is turned on. Consequently, flip-flop 212a operates under the identical conditions as flip-flop 211. As a result, the pair of flip-flops 211 and 212a operates as an ordinary D-flip-flop (data latch circuit) and sequential circuit 22 functions as an ordinary sequential operation to the input data when control signal DTC is at the inactive mode.

When control signal DTC is at the active mode and the clock signal CK is at the inactive mode, flip-flop 211 receives the input data and allows them to go through direct. Third transfer gate T25 of flip-flop 212a is turned on and fourth transfer gate T26 is turned off. As a result, because the output of flip-flop 211 is supplied to combinational circuit 21b through third transfer gate T25 and inverter IV23, the pair of flip-flops 211 and 212a operate under data-through conditions.

As can be seen, by providing means of keeping the prescribed flip-flops of sequential circuit 22, sequential circuit 22 can be kept in the data-through condition and, as a result, combinational circuit 21a, sequential circuit 22 and combinational circuit 21b can be changed into a single combinational circuit which can be tested as a whole.

In the case of the practical example shown, the number of input and output terminals which, in the prior art, required as many as three can be reduced to only one to be used for control signal DTC. The required number of input and output terminals can thus be drastically reduced. Moreover, since the multiplexer for switching between the Scan Path data and the ordinary data can be dispensed with, the overhead originated by hardware has the merit of being minimized.

Figure 3A:
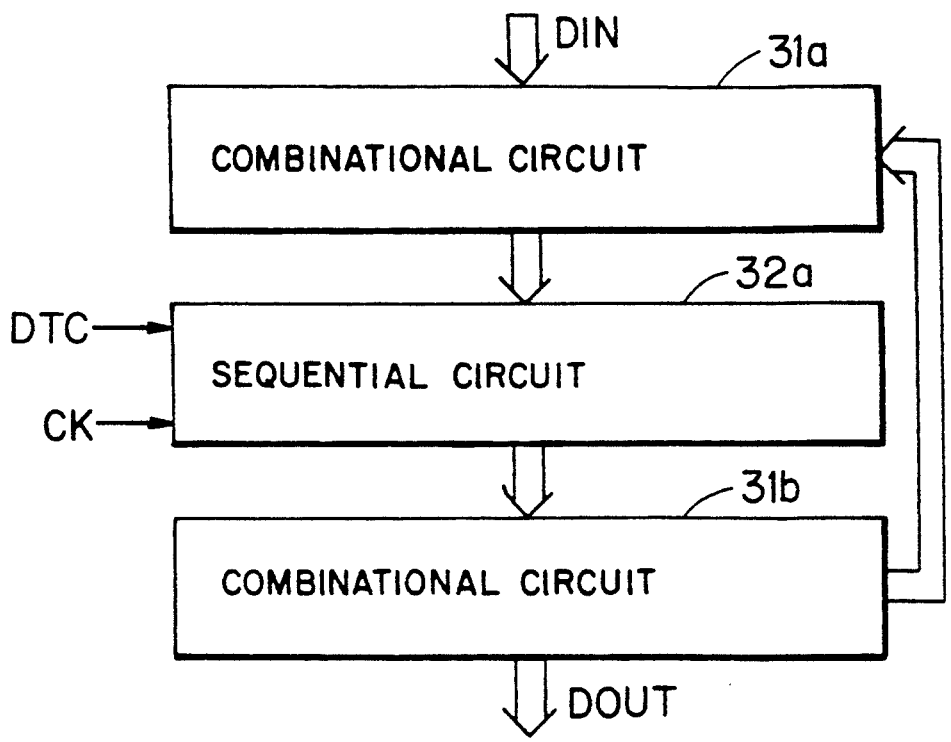
FIG. 3a shows a block diagram of a second practical example of the semiconductor integrated circuit of the present invention.
Figure 3B:
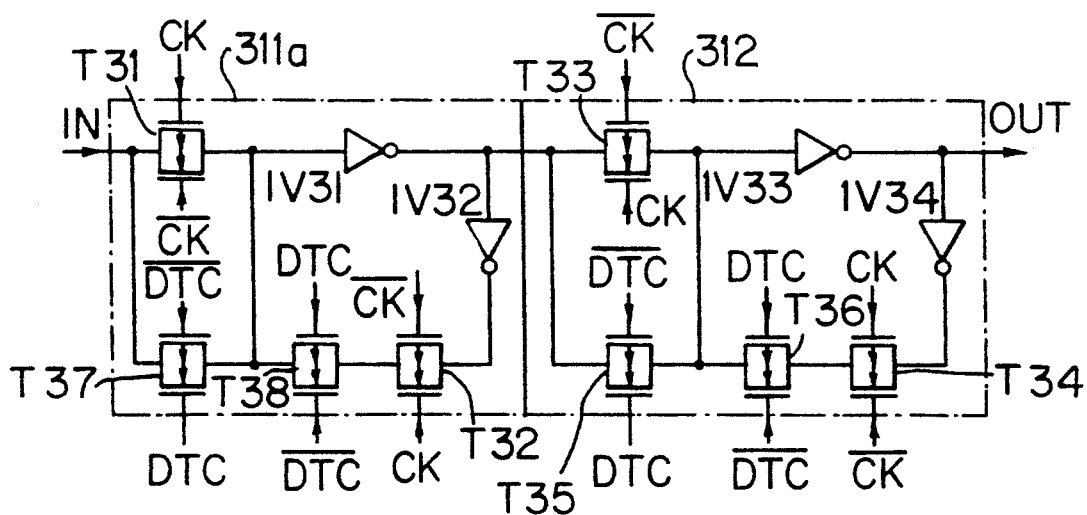

FIG. 3a is a block diagram showing the second practical example of the present invention. FIG. 3b shows a practical circuit diagram of the flip-flop circuit portion of the second practical example of the present invention.

The pair of flip-flops 311a and 312 in the present example operate similarly to flip-flop 212a shown in FIG. 2b and the inverters IV31, IV32 and transfer gates T31, T32, T37, T38 as well as inverters IV33, IV34 and transfer gates T33–T36 are constituted in a similar manner to inverters IV23, IV24 and transfer gates T23–T26 shown in FIG. 2b.

As has already been clarified, data-though means is provided in the present example to each flip-flop which functions as a data-through circuit when the control signal DTC is at the active mode with no regard to the polarity of clock signal CK.

Incidentally, the value of the overhead in the conventional example usually ranges between 20 and 50 percent, while in the case of the present example, it is no more than 10 percent.

Although variations in the embodiment described above are possible, the scope of the present invention is defined in the appended claims.

What is claimed is:

1. A semiconductor integrated circuit comprising:
   a sequential circuit consisting of a plurality of flip-flops which latch and keep data supplied to an input terminal at a prescribed timing and which perform prescribed sequential treatments of the input data;
   a combinational circuit which is implemented at the input terminals of said sequential circuit and which performs a prescribed combinational treatment or treatments of the input data to said sequential circuit;
   data-through means operated by an external control signal designed to transfer the data supplied to the input terminal direct to an output terminal of a prescribed flip-flop of said plurality of flip-flops of said sequential circuit,
   wherein said flip-flops comprise a first transfer gate designed to transfer and control on and off input data in accordance with a clock signal supplied thereto, a first inverter designed to reverse the polarity of the input data signal received as the output of the first transfer gate to be transferred to the output terminal, a second inverter designed to reverse the polarity of the input data signal received as the output of the first inverter, a second transfer gate designed to transfer and control the output data of said second inverter turned on and off by the clock signal of opposite polarity to said first transfer gate, and wherein data-through means comprises a third transfer gate connected in parallel to said first transfer gate and turned on and off by said external control signal, and a fourth transfer gate connected in series to said second transfer gate and turned on and off in opposite polarity of said third transfer gate by said external control signal.

2. A semiconductor integrated circuit comprising:
   a sequential circuit consisting of a plurality of flip-flops which latch and keep data supplied to an output terminal at a prescribed timing and which perform prescribed sequential treatments of the input data;
   a combinational circuit which is implemented at the output terminals of said sequential circuit and which performs a prescribed combinational treatment or treatments of the output data from said sequential circuit;
   data-through means operated by an external control signal designed to transfer the data supplied to the input terminal direct to an output terminal of a prescribed flip-flop of said flip-flops of said sequential circuit,
   wherein said flip-flops comprise a first transfer gate designed to transfer and control on and off input data in accordance with a clock signal supplied thereto, a first inverter designed to reverse the polarity of the input data signal received as the output of the first transfer gate to be transferred to the output terminal, a second inverter designed to reverse the polarity of the input data signal received as the output of the first inverter, a second transfer gate designed to transfer and control the output data of said second inverter turned on and off by the clock signal of the opposite polarity to said first transfer gate, and wherein said data-through means comprises a third transfer gate connected in parallel to said first transfer gate and turned on and off by said external control signal, and a fourth transfer gate connected in series to said second transfer gate and turned on and off in opposite polarity of said third transfer gate by said external control signal.

3. A test method for the semiconductor integrated circuit including:
   a sequential circuit consisting of a plurality of flip-flops which latch and keep data supplied to an input terminal at a prescribed timing and which perform prescribed sequential treatments of the input data; a combinational circuit which is implemented at the input terminals of said sequential circuit and which performs a prescribed combinational treatment or treatments of the input data to said sequential circuit; data-through means operated by an external control signal designed to transfer the data supplied to the input terminal direct to an output terminal of a prescribed flip-flop of said plurality of flip-flops of said sequential circuit, the flip-flops including a first transfer gate designed to transfer and control on and off input data in accordance with a clock signal, a first inverter designed to reverse the polarity of the input data signal received as the output of the first transfer gate to be transferred to the output terminal, a second inverter designed to reverse the polarity of the input data signal received as the output of the first inverter, a second transfer gate designed to transfer and control the output data of said second inverter turned on and off by the clock signal of opposite polarity to said first transfer gate, and data-through means including a third transfer gate connected in parallel to said first transfer gate and turned on and off by said external control signal, and a fourth transfer gate connected in series to said second transfer gate and turned on and off in opposite polarity of said third transfer gate by said external control signal, the method comprising the steps of:
   operating a prescribed flip-flop out of said plurality of flip-flops constituting the sequential circuit in the data-through mode by applying said external control signal in order to make the entire semiconductor integrated circuit a signal combinational circuit in which the input data is transferred direct to the output terminal, thereby making it possible to test the semiconductor integrated circuit using ordinary data as the input signal.

4. A test method for the semiconductor integrated circuit including a sequential circuit consisting of a plurality of flip-flops which latch and keep data supplied to an input terminal at a prescribed timing and which perform prescribed sequential treatments of the input data; a combinational circuit which is implemented at the output temrainls of said sequential circuit and which performs a prescribed combinational treatment or treatments of the output data from said sequential circuit; and data-through means operated by an external control signal designed to transfer the data supplied to the input terminal direct to an output terminal of a prescribed flip-flop of said plurality of flip-flops of said sequential circuit, the flip-flops including a first transfer gate designed to transfer and control on and off input data in accordance with a clock signal, a first inverter designed to reverse the polarity of the input data signal received as the output of the first transfer gate to be transferred to the output terminal, a second inverter designed to reverse the polarity of the input data signal received as the output of the first inverter, a second transfer gate designed to transfer and control the output data of said second inverter turned on and off by the clock signal of opposite polarity to said first transfer gate, and data-through means including a third transfer gate connected in parallel to said first transfer gate and turned on and off by said external control signal, and a fourth transfer gate connected in series to said second transfer gate and turned on and off in opposite polarity of said third transfer gate by said external control signal, the method comprising the steps of:

operating a prescribed flip-flop out of said plurality of flip-flops constituting the sequential circuit in the data-through mode by applying said external control signal in order to make the entire semiconductor integrated circuit a signal combinational circuit in which the input data is transferred direct to the output terminal, thereby making it possible to test the semiconductor integrated circuit using ordinary data as the input signal.

* * * * *